United States Patent
Tokano et al.

(10) Patent No.: US 7,391,077 B2
(45) Date of Patent: Jun. 24, 2008

(54) VERTICAL TYPE SEMICONDUCTOR DEVICE

(75) Inventors: Kenichi Tokano, Kawasaki (JP); Atsuko Yamashita, Yokosuka (JP); Koichi Takahashi, Kitakyushu (JP); Hideki Okumura, Yokohama (JP); Shingo Sato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

(21) Appl. No.: 10/983,658

(22) Filed: Nov. 9, 2004

(65) Prior Publication Data
US 2005/0121704 A1   Jun. 9, 2005

(30) Foreign Application Priority Data
Nov. 18, 2003   (JP) .............................. 2003-388076

(51) Int. Cl.
*H01L 21/764* (2006.01)
(52) U.S. Cl. .................. 257/329; 257/510; 257/E29.02; 438/421
(58) Field of Classification Search .................. 257/510, 257/329–330, E29.02; 438/421
See application file for complete search history.

(56) References Cited
U.S. PATENT DOCUMENTS
4,356,211 A * 10/1982 Riseman ..................... 438/422

5,926,721 A * 7/1999 Hong et al. .................. 438/413
6,268,637 B1 * 7/2001 Gardner et al. ............... 257/522
6,362,072 B1 * 3/2002 Zambrano .................... 438/421
6,740,931 B2 * 5/2004 Kouzuki et al. ............. 257/341

FOREIGN PATENT DOCUMENTS
| JP | 2-119238 | 5/1990 |
|---|---|---|
| JP | 11-243142 | 9/1999 |
| JP | 2001-522146 | 11/2001 |
| JP | 2003-309261 | 10/2003 |

* cited by examiner

*Primary Examiner*—Howard Weiss
*Assistant Examiner*—John C Ingham
(74) *Attorney, Agent, or Firm*—Oblon, Spivak, McClelland, Maier & Neustadt, P.C.

(57) ABSTRACT

Provided is a semiconductor device including a semiconductor substrate which includes a first semiconductor layer of a first conductivity and a pair of second semiconductor layers disposed on the first semiconductor layer and spaced apart from each other to form a trench therebetween, wherein the second semiconductor layer includes a first impurity-diffused region of the first conductivity extending from a lower surface toward an upper surface of the second semiconductor layer, and a second impurity-diffused region of a second conductivity which extends from the lower surface toward the upper surface and is adjacent to the first impurity-diffused region, an insulating layer covering a sidewall of the trench, and a cap layer which is in contact with the semiconductor substrate and covers an opening of the trench to form an enclosed space in the trench, a material of the cap layer being almost the same as that of the semiconductor substrate.

8 Claims, 14 Drawing Sheets

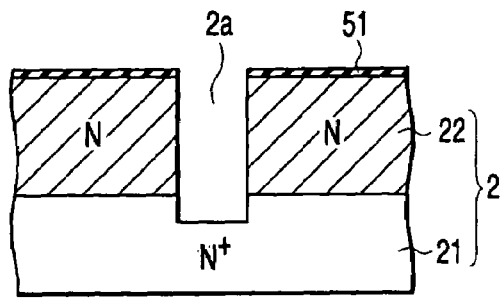
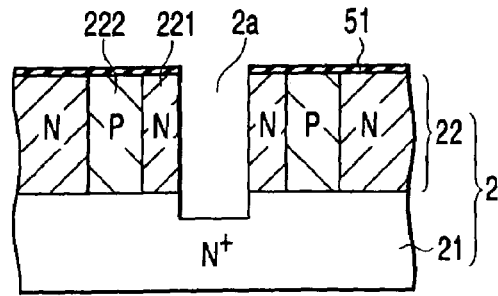
FIG. 3          FIG. 4
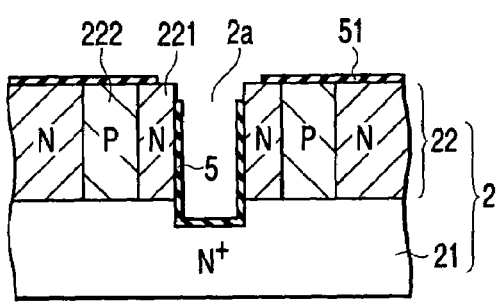
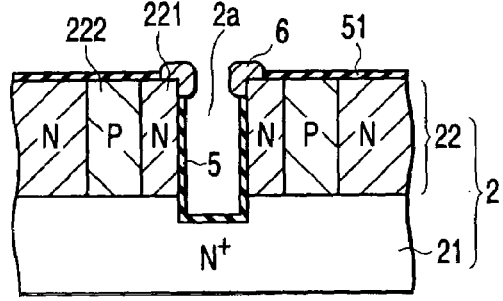
FIG. 5          FIG. 6
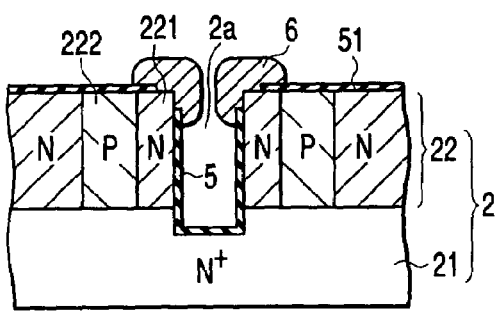
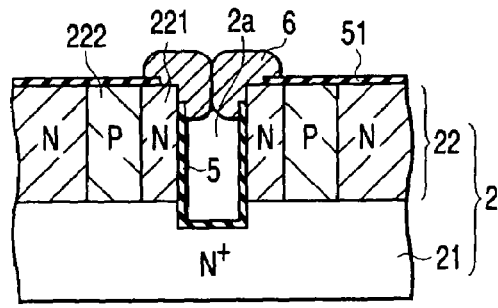
FIG. 7          FIG. 8

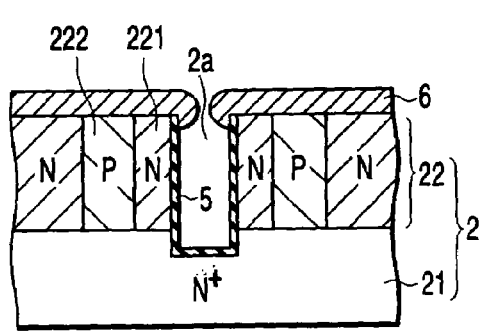
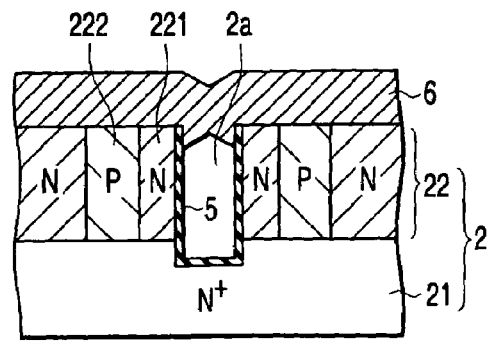
FIG. 27  FIG. 28
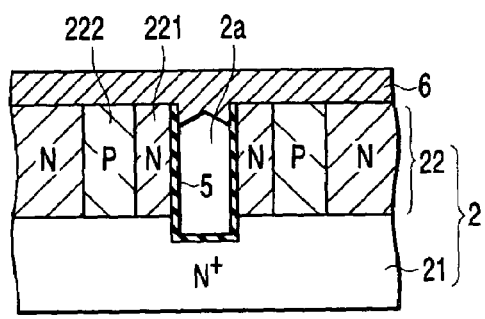
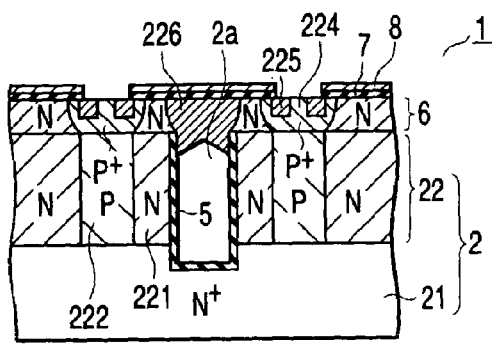
FIG. 29  FIG. 30
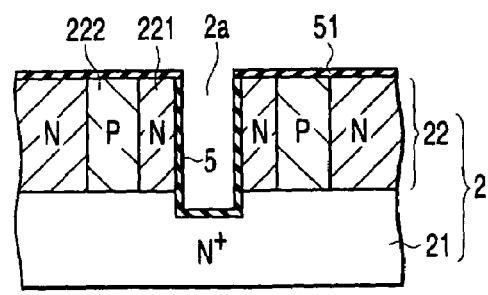
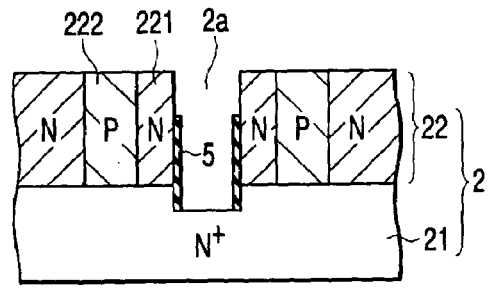
FIG. 31  FIG. 32

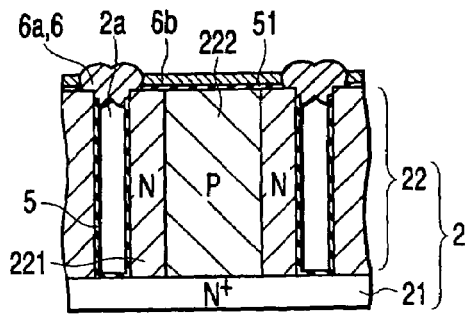
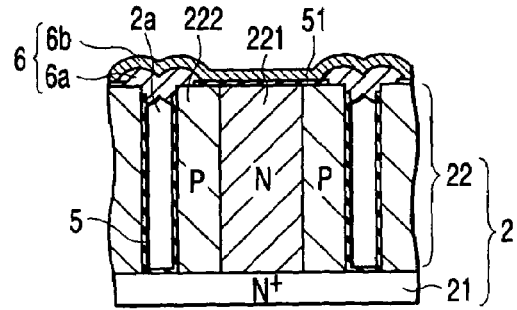
FIG. 60
FIG. 61
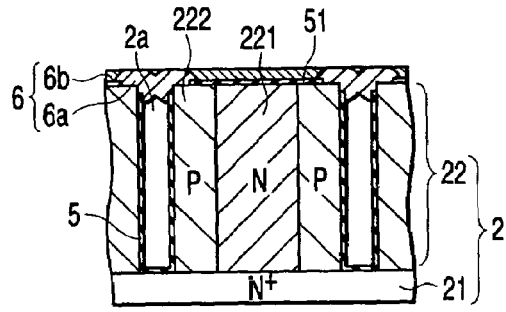
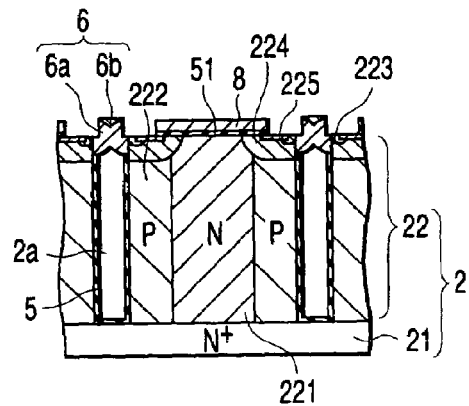
FIG. 62
FIG. 63
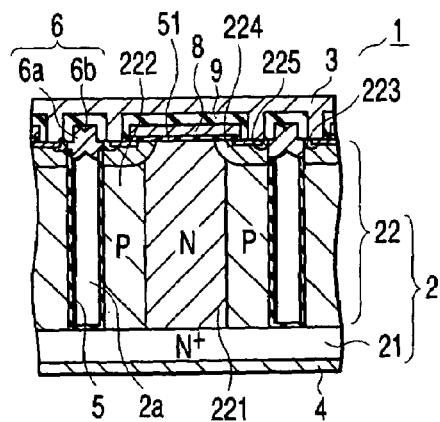
FIG. 64

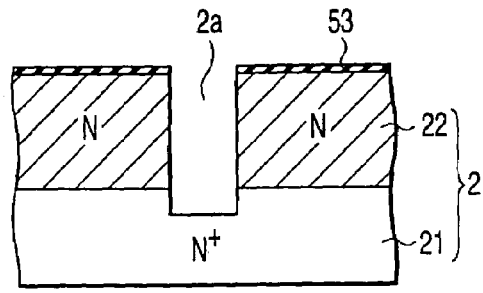
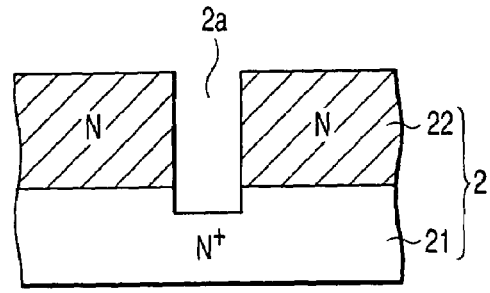
FIG. 65  FIG. 66
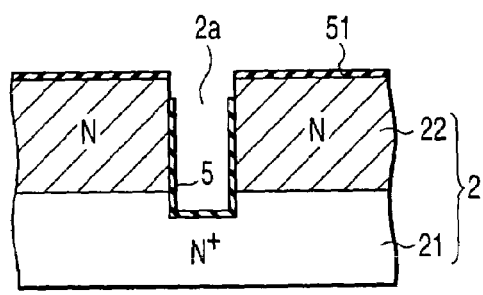
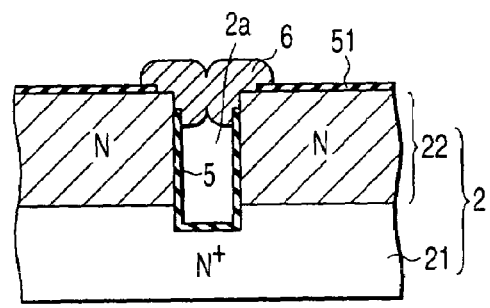
FIG. 67  FIG. 68
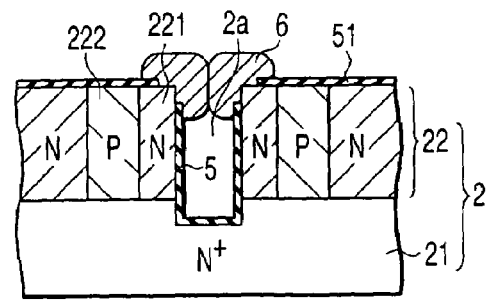
FIG. 69

VERTICAL TYPE SEMICONDUCTOR DEVICE

CROSS-REFERENCE TO RELATED APPLICATIONS

This application is based upon and claims the benefit of priority from prior Japanese Patent Application No. 2003-388076, filed Nov. 18, 2003, the entire contents of which are incorporated herein by reference.

BACKGROUND OF THE INVENTION

1. Field of the Invention

The present invention relates to a semiconductor device and a method of manufacturing the same.

2. Description of the Related Art

Trench isolation has widely been used in the field of semiconductor devices. Trench isolation is utilized for isolation of a MOS (Metal Oxide Semiconductor) transistor, bipolar transistor, and the like.

One of trench isolation techniques is to cover the opening of a trench with a cap layer made of an insulator and form an airtight space in the trench. This technique is disclosed in Jpn. Pat. Appln. KOKAI Publication No. 2-119238. According to this technique, the trench is filled with gas whose relative dielectric constant is low. This technique is effective particularly in a high voltage device.

However, the present inventors have found that a cap layer formed by the prior art is readily destructed in a heat treatment such as activation annealing.

BRIEF SUMMARY OF THE INVENTION

According to a first aspect of the present invention, there is provided a semiconductor device, comprising a semiconductor substrate comprising a first semiconductor layer of a first conductivity and a pair of second semiconductor layers disposed on the first semiconductor layer and spaced apart from each other, the second semiconductor layers forming a trench therebetween, wherein each of the second semiconductor layers includes a first impurity-diffused region of the first conductivity which extends from a lower surface toward an upper surface of the second semiconductor layer, and a second impurity-diffused region of a second conductivity which extends from the lower surface toward the upper surface and is adjacent to the first impurity-diffused region, an insulating layer covering a sidewall of the trench, and a cap layer which is in contact with the semiconductor substrate and covers an opening of the trench to form an enclosed space in the trench, a material of the cap layer being substantially the same as a material of the semiconductor substrate.

According to a second aspect of the present invention, there is provided a method of manufacturing a semiconductor device, comprising forming a structure which comprises a semiconductor substrate with a trench and an insulating layer covering a sidewall of the trench, wherein a surface of the semiconductor substrate comprises an uncovered portion on which the insulating layer is absent at and/or near an opening of the trench, forming a cap layer which covers the opening of the trench to form an enclosed space in the trench, forming the cap layer including epitaxially growing a material which is substantially the same as a material of the semiconductor substrate on the uncovered portion to form a single crystal layer which covers the opening of the trench, and after forming the cap layer, subjecting the structure to at least one heat treatment, the heat treatment being carried out while keeping a composition of an exposed portion of the cap layer which is exposed to the enclosed space substantially the same as a composition of the semiconductor substrate.

BRIEF DESCRIPTION OF THE SEVERAL VIEWS OF THE DRAWING

FIGS. 2 to 10 are sectional views schematically showing a method of manufacturing a semiconductor device according to the first embodiment of the present invention;

FIGS. 25 to 30 are sectional views schematically showing a method of manufacturing a semiconductor device according to the second embodiment of the present invention;

FIGS. 31 to 37 are sectional views schematically showing a method of manufacturing a semiconductor device according to the third embodiment of the present invention;

FIG. 60 is a sectional view schematically showing an example of a structure obtained when Si is grown by nonselective epitaxial growth instead of forming a polysilicon layer shown in FIG. 55 by LP-CVD;

FIGS. 61 to 64 are sectional views schematically showing a method of manufacturing a semiconductor device according to the eighth embodiment of the present invention; and FIGS. 65 to 69 are sectional views schematically showing a method of manufacturing a semiconductor device according to the ninth embodiment of the present invention.

DETAILED DESCRIPTION OF THE INVENTION

Figure 1:
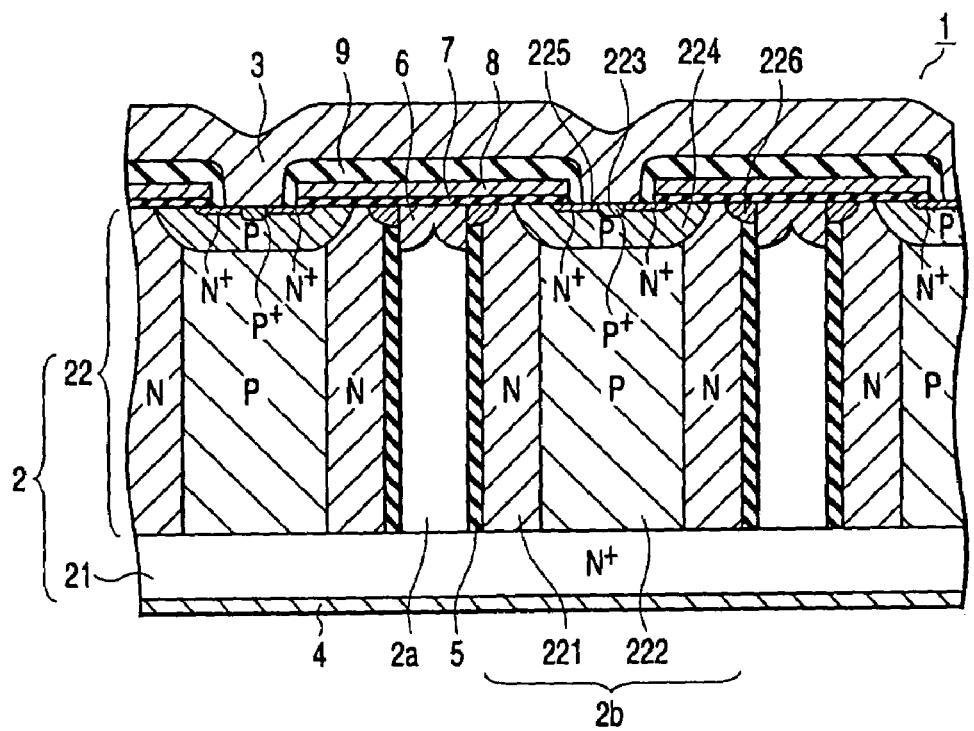
FIG. 1 is a sectional view schematically showing a semiconductor device according to the first embodiment of the present invention.

Embodiments of the present invention will be described below with reference to the several views of the accompanying drawing. In the following views, the same reference numerals denote components having the same or similar functions, and a repetitive description thereof will be omitted.

FIG. 1 is a sectional view schematically showing a semiconductor device according to the first embodiment of the present invention. The semiconductor device 1 includes a vertical power MOSFET.

The semiconductor device 1 includes a semiconductor substrate 2. Trenches 2a are formed in one major surface of the semiconductor substrate 2. The trenches 2a form isolation regions, and define device regions 2b between the trenches 2a. The trenches 2a are typically very deep and have an aspect ratio of e.g., 20 or more.

A source electrode 3 is formed as a common electrode on the upper surface of the semiconductor substrate 2. A drain electrode 4 is formed as a common electrode on the lower surface of the semiconductor substrate 2. The semiconductor device 1 in FIG. 1 supplies a drain current in the direction of thickness of the semiconductor substrate 2, i.e., in the vertical direction.

The semiconductor substrate 2 includes a first semiconductor layer 21 of the first conductivity, $N^+$-type in this case, which is utilized as a heavily doped drain region, and a plurality of second semiconductor layers 22 spaced apart from each other on the first semiconductor layer 21. The first semiconductor layer 21 is, e.g., a silicon substrate, and the second semiconductor layer 22 is, e.g., a silicon layer formed on the first semiconductor layer 21 by epitaxial growth or the like.

The trench 2a is a recess formed between adjacent second semiconductor layers 22. The bottom surface of the trench 2a is flush with the upper surface of the first semiconductor layer 21, but may be positioned lower than the upper surface of the first semiconductor layer 21. That is, a recess communicating with the gap between the second semiconductor layers 22 may be formed in the upper surface of the first semiconductor layer 21.

Each second semiconductor layer 22 includes a first impurity-diffused region 221 of the first conductivity, N-type in this case, which extends from the lower surface toward the upper surface of the second semiconductor layer 22, and a second impurity-diffused region 222 of the second conductivity, P-type in this case, which extends from the lower surface toward the upper surface of the second semiconductor layer 22 and is adjacent to the first impurity-diffused region 221. In this example, the first impurity-diffused region 221 is positioned between the trench 2a and the second impurity-diffused region 222. The impurity-diffused regions 221 and 222 are formed by, for example, introducing impurities from the sidewall of the trench 2a into the semiconductor substrate 2, and diffusing and activating the impurities in the semiconductor substrate 2.

The second semiconductor layer 22 further includes a third impurity-diffused region 223 of the second conductivity, $P^+$-type in this case, a source region 225 of the first conductivity, $N^+$-type in this case, a base region 224 of the second conductivity, P-type in this case, and a channel stopper region 226. The third impurity-diffused region 223 is positioned in the surface region of the second semiconductor layer 22 above the center of the second impurity-diffused region 222, and extends in a direction perpendicular to the sheet surface. The source regions 225 are positioned in the surface region of the second semiconductor layer 22, and sandwich the third impurity-diffused region 223. The base region 224 is interposed between a layer including the third impurity-diffused region 223 and source region 225 and a layer including the first impurity-diffused region 221 and second impurity-diffused region 222, and extends in a direction perpendicular to the sheet surface. The channel stopper region 226 is positioned near the trench 2a in the surface region of the second semiconductor layer 22, and extends in a direction perpendicular to the sheet surface. The conductivity of the channel stopper region 226 is an $N^+$-type or $P^+$-type.

An insulating layer 5 is formed on the sidewall of the trench 2a, i.e., the side surface of the second semiconductor layer 22. The insulating layer 5 covers a portion of the side surface of the second semiconductor layer 22 which is positioned below the channel stopper region 226. The channel stopper region 226 may extend to the side portion of the insulating layer 5 owing to a thermal diffusion of impurities. In this case, the insulating layer 5 partially covers a region of the side surface of the second semiconductor layer 22 which corresponds to the channel stopper region 226.

The opening of the trench 2a is covered with a cap layer 6 to form an enclosed space in the trench 2a. The cap layer 6 is formed in contact with the semiconductor substrate 2. The material of the cap layer 6 is substantially the same as that of the semiconductor substrate 2. In this example, the cap layer 6 is a single crystal layer. When a given material is the same as another material, this means that their components are the same except impurities.

Gate insulators 7 and gate electrodes 8 are sequentially formed on a surface of the semiconductor substrate 2 in which the source regions 225 are formed. Each gate electrode 8 faces at least portions of the surface of the substrate 2 which are positioned between a pair of source regions 225 sandwiching the cap layer 6. In each device region 2b, the source electrode 3 is connected to the source regions 225. In this case, the gate electrode 8 is also formed above the cap layer 6, but may not exist above the cap layer 6.

In the first embodiment, a single crystal layer made of almost the same material as that of the semiconductor substrate 2 is formed as the cap layer 6. In the first embodiment, at least one heat treatment after forming the cap layer 6, typically all heat treatments after forming the cap layer 6 are carried out while the composition of a portion of the single crystal layer which is exposed in the space within the trench 2a is maintained at almost the same composition of the semiconductor substrate 2. This can suppress destruction of the cap layer 6 even upon heating up to about 1,100° C. in a heat treatment such as activation annealing, which will be described later. When the composition of a given component is almost the same as that of another component, this means that their compositions are the same except impurities.

The present inventors investigated why the cap layer was readily destructed in a heat treatment according to the prior art. The present inventors have found that the cause is the use of an insulator for the cap layer.

More specifically, a cap layer made of an insulator is different in thermal expansion coefficient from the semiconductor substrate 2. In a heat treatment, a high stress is applied to the cap layer of the insulator. In addition, the cap layer of the insulator must be formed in an oxidizing atmosphere such as an oxygen atmosphere. Thus, oxidizing gas such as oxygen gas is trapped in a trench sealed by the cap layer. If heating is performed in this state, gas trapped in the trench tends to expand, and a very high stress is applied to the cap layer. Such stress destructs the cap layer.

To the contrary, when the material of the cap layer 6 is almost the same as that of the semiconductor substrate 2, their thermal expansion coefficients can be set almost equal to each other. In addition, when the material of the cap layer 6 is almost the same as that of the semiconductor substrate 2, the cap layer 6 can be formed by a vacuum process such as epitaxial growth. This can prevent entrapment of gas in a trench sealed by the cap layer 6. In other words, the interior of the trench sealed by the cap layer 6 becomes a vacuum. Hence, no stress is applied to the cap layer 6 owing to the difference in thermal expansion coefficient or expansion of gas by heating, suppressing destruction of the cap layer 6 in a heat treatment.

When the material of the cap layer 6 is almost the same as that of the semiconductor substrate 2, the cap layer 6 hardly generates gas in a heat treatment, unlike a case in which an insulator is used as the material of the cap layer. From this viewpoint, it is effective for suppressing destruction of the cap layer 6 in a heat treatment to set the material of the cap layer 6 to almost the same as that of the semiconductor substrate 2.

The semiconductor device 1 can be manufactured by, e.g., the following method. The manufacturing method will be explained with reference to FIGS. 2 to 10.

FIGS. 2 to 10 are sectional views schematically showing a method of manufacturing a semiconductor device according to the first embodiment of the present invention. FIGS. 2 to 10 assume that only one trench 2a is formed for illustrative convenience.

Figure 2:
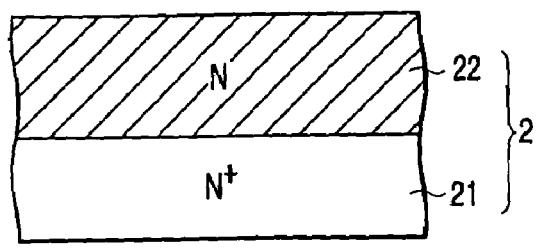

According to this method, as shown in FIG. 2, an N-type semiconductor layer 22 is formed on an $N^+$-type semiconductor substrate 21 by epitaxial growth. For example, Si is used for the $N^+$-type semiconductor substrate 21 and N-type semiconductor layer 22.

As shown in FIG. 3, the surface of the N-type semiconductor layer 22 is oxidized to form a silicon oxide layer 51. The silicon oxide layer 51 is patterned, and the N-type semiconductor layer 22 is etched to form a trench 2a having a width of, e.g., 4 µm.

B is ion-implanted into the sidewall of the trench 2a and thermally diffused. Subsequently, As is ion-implanted into the sidewall of the trench 2a and thermally diffused. Accordingly, as shown in FIG. 4, an N-type first impurity-diffused region 221 and P-type second impurity-diffused region 222 are obtained. Ion implantation for forming the first impurity-diffused region 221 may be performed before ion implantation for forming the second impurity-diffused region 222. Alternatively, ion implantation for forming the first impurity-diffused region 221 may be performed after ion implantation for forming the second impurity-diffused region 222. The heat treatment for causing a thermal diffusion may be carried out every time ion implantation is performed, or after both ion implantation for forming the first impurity-diffused region 221 and ion implantation for forming the second impurity-diffused region 222 are performed. The heat treatment for causing a thermal diffusion may be carried out on this stage, or on a later stage.

As shown in FIG. 5, the exposed surface of the substrate 2 is oxidized to form a silicon oxide layer 5. Portions of the silicon oxide layers 5 and 51 which are positioned near the opening of the trench 2a are removed. As a result, the substrate 2 is partially exposed to the outside of the silicon oxide layers 5 and 51. The method of partially removing the silicon oxide layers 5 and 51 will be explained in detail later.

As shown in FIGS. 6 to 8, Si 6 is epitaxially grown on the exposed portion of the substrate 2. The growth of the Si 6 is done under conditions in which the Si 6 grows on only the exposed portion of the substrate 2 and does not grow on the silicon oxide layer. For example, $H_2$ gas, $SiH_2Cl_2$ gas, and HCl gas are respectively supplied at flow rates of 10 slm, 50 sccm, and 10 sccm at a temperature of 1,000° C. and a pressure of 10 Torr.

As shown in FIGS. 6 to 8, the Si 6 grows on the exposed portion of the substrate 2 in the vertical and horizontal directions. The Si 6 which grows on the side surface of one semiconductor layer 22 and the Si 6 which grows on the side surface of the other semiconductor layer 22 are linked to each other. For example, when the opening width of the trench 2a is 4 µm, the Si 6 is kept growing for about 40 min under the above-mentioned conditions. A cap layer 6 which covers the opening of the trench 2a can be obtained.

Figure 9:
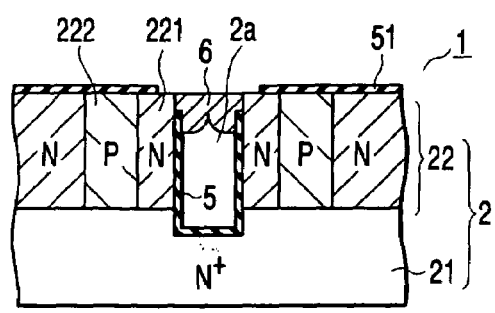

As shown in FIG. 9, a surface of the substrate 2 on which the cap layer 6 is formed is planarized by CMP (Chemical Mechanical Polishing). At this time, the silicon oxide layer 51 can be used as a stopper film. The silicon oxide layer 51 can prevent formation of an opening in the cap layer 6 due to excessive planarization.

Figure 10:
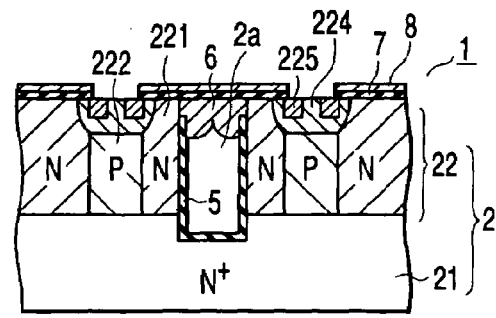

As shown in FIG. 10, the silicon oxide layer 51 is removed, and ion implantation of an impurity and a thermal diffusion are performed to form a $P^+$-type base region 224 and $N^+$-type source region 225 in the surface region of the substrate 2. In the example shown in FIGS. 2 to 10, neither the P-type impurity-diffused region 223 nor the channel stopper region 226 shown in FIG. 1 is formed. In this example, the cap layer 6 is an $N^+$-type impurity-diffused layer.

After that, a gate insulator 7 such as a silicon oxide layer, a gate electrode 8 such as a polysilicon layer, an insulating layer 9 such as a silicon oxide layer, and a source electrode 3 and drain electrode 4 such as Al/TiW layers are formed. A semiconductor device 1 having almost the same structure as that shown in FIG. 1 is completed.

In this method, as described with reference to FIGS. 5 to 8, the substrate 2 is partially exposed to the outside of the silicon oxide layers 5 and 51, and the Si 6 is grown on the exposed portion of the substrate 2. The structure shown in FIG. 5 can be formed by, e.g., the following method.

FIGS. 11 to 15 are sectional views schematically showing an example of a method available for obtaining the structure in FIG. 5.

Figure 11:
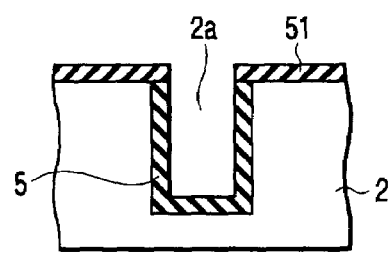
FIGS. 11 to 15 are sectional views schematically showing an example of a method available for obtaining a structure in FIG. 5.

According to this method, a structure shown in FIG. 4 is prepared. As shown in FIG. 11, the exposed surface of the substrate 2 is oxidized to form a silicon oxide layer 5. The silicon oxide layer 5 is formed to have a thickness of, e.g., 3,000 Å.

Figure 12:
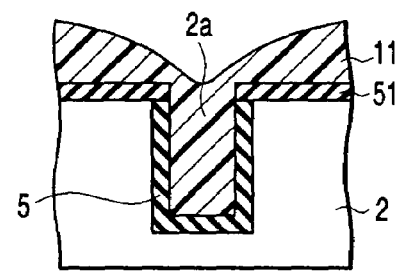

As shown in FIG. 12, a resist is applied to a surface of the substrate 2 in which the trench 2a is formed, forming a resist layer 11. The resist layer 11 is so formed as to be recessed at the position of the trench 2a. The resist layer 11 becomes thin at the boundary between the upper surface of the silicon oxide layer 51 and the sidewall of the trench 2a.

Figure 13:
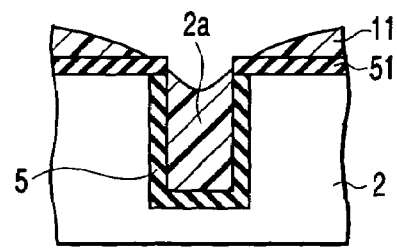

As shown in FIG. 13, the resist layer 11 is uniformly etched by RIE (Reactive Ion Etching). The oxide layer 5 and/or oxide layer 51 is exposed to the outside of the resist layer 11 at the boundary.

Figure 14:
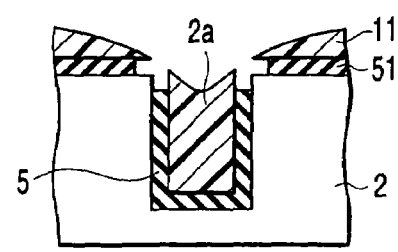

As shown in FIG. 14, a hydrofluoric acid treatment or ammonium fluoride treatment is performed to etch portions of the oxide layers 5 and 51 which are exposed to the outside of the resist layer 11. For example, etching is done for 4 min with an aqueous ammonium fluoride solution.

Figure 15:
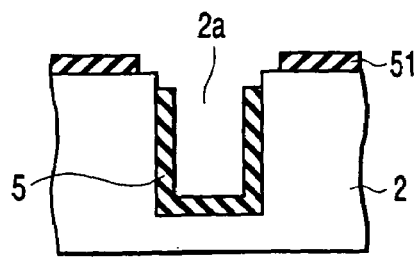

As shown in FIG. 15, the resist layer 11 is removed. In this manner, the structure shown in FIG. 5 can be obtained.

FIGS. 16 to 20 are sectional views schematically showing another example of the method available for obtaining the structure in FIG. 5.

According to this method, a structure shown in FIG. 4 is obtained. A LOCOS (Local Oxidation of Silicon) process is carried out to obtain a structure shown in FIG. 16. In the LOCOS process, the silicon oxide layer 51 is selectively grown such that the silicon oxide layer 51 covering the upper surface of the substrate 2 becomes thicker than the silicon oxide layer 5 covering the sidewall and bottom surface of the trench 2a. For example, the LOCOS process is performed such that the silicon oxide layer 51 has a thickness of 9,000 Å to 10,000 Å and a portion of the silicon oxide layer 5 which is positioned on the sidewall of the trench 2a has a thickness of 500 Å to 1,000 Å.

Figure 17:
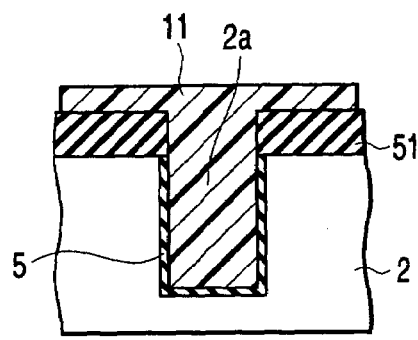

As shown in FIG. 17, a resist layer 11 is formed on the oxide layers 5 and 51 by spin coating or the like. The resist layer 11 is formed to have an almost flat upper surface. The trench 2a is filled with the resist layer 11, and the oxide layer 51 is covered with the resist layer 11.

Figure 18:
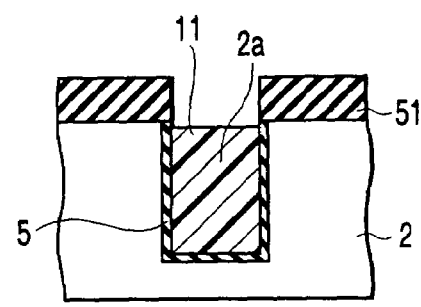

The resist layer 11 is etched by using, e.g., an ozone asher. As shown in FIG. 18, etching stops when the upper surface position of the resist layer 11 becomes lower than the lower surface of the silicon oxide layer 51, typically when the upper surface position of the resist layer 11 becomes slightly lower than the upper surface of the substrate 2.

Figure 19:
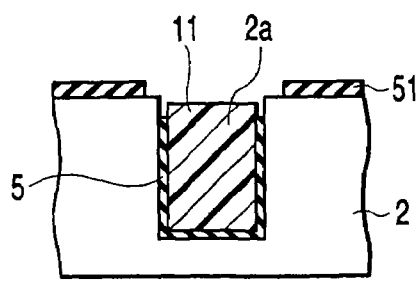

Subsequently, a hydrofluoric acid treatment or ammonium fluoride treatment is performed to etch portions of the oxide layers 5 and 51 which are exposed to the outside of the resist layer 11. For example, etching is done for 4 min with an aqueous ammonium fluoride solution. Since this etching is isotropic etching, etching of the upper and side surfaces of the oxide layer 51 and etching of a portion of the oxide layer 5 which is exposed to the outside of the resist layer 11 progress simultaneously. By stopping etching at a proper timing, a structure shown in FIG. 19 is obtained.

Figure 20:
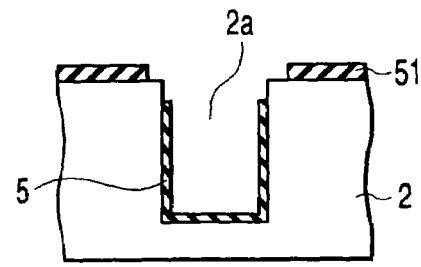

As shown in FIG. 20, the resist layer 11 is removed. Consequently, the structure shown in FIG. 5 can be obtained.

FIGS. 21 to 24 are sectional views schematically showing still another example of the method available for obtaining the structure in FIG. 5.

Figure 16:
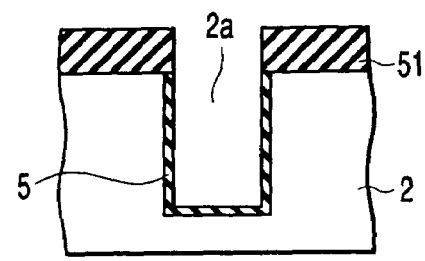
FIGS. 16 to 20 are sectional views schematically showing another example of the method available for obtaining the structure in FIG. 5.
Figure 21:
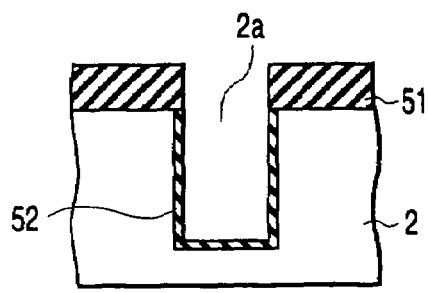
FIGS. 21 to 24 are sectional views schematically showing still another example of the method available for obtaining the structure in FIG. 5.

According to this method, a structure shown in FIG. 21 is obtained by the same method as that described with reference to FIG. 16. The silicon oxide layer 51 has a thickness of, e.g., 9,000 Å to 10,000 Å, and a portion of a silicon oxide layer 52 which is positioned on the sidewall of the trench 2a has a thickness of, e.g., 500 Å to 1,000 Å.

Figure 22:
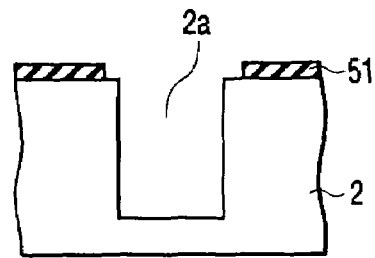
Figure 23:
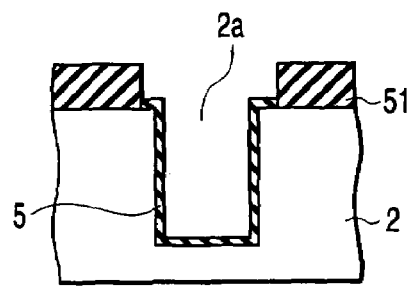

The silicon oxide layers 51 and 52 are etched with a hydrofluoric acid solution. Since this etching is isotropic etching, etching of the upper and side surfaces of the oxide layer 51 and etching of the major surface of the oxide layer 52 progress simultaneously. By stopping etching at a proper timing, a structure shown in FIG. 22 is obtained in which the oxide layer 52 is completely removed and the upper surface of the substrate 2 is exposed to the outside of the silicon oxide layer 51 at the opening of the trench 2a. The structure shown in FIG. 22 can be obtained by an etching amount of, e.g., 4,000 Å to 5,000 Å.

For example, thermal oxidation is performed to form a silicon oxide layer 5 on the exposed surface of the substrate 2 and grow the oxide layer 51. Thermal oxidation is done such that the silicon oxide layer 5 has a thickness of 1,000 Å to 2,000 Å on the sidewall of the trench 2a. As a result, a structure shown in FIG. 23 can be obtained.

Figure 24:
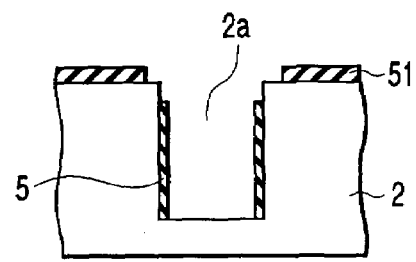

Thereafter, the silicon oxide layers 5 and 51 are anisotropically etched. As shown in FIG. 24, anisotropic etching is performed such that a portion of the silicon oxide layer 5 which is positioned at the opening of the trench 2a is removed and the silicon oxide layer 51 remains. For example, anisotropic etching is done by an etching amount of 2,500 Å to 5,000 Å. In this way, the structure shown in FIG. 5 is obtained. In this case, a structure in which the bottom surface of the trench 2a is also exposed to the outside of the silicon oxide layer 5 is obtained, as shown in FIG. 24.

The second embodiment of the present invention will be described.

In the first embodiment, epitaxial growth of Si occurs only near the opening of the trench 2a. In the second embodiment, epitaxial growth of Si also occurs on the upper surface of a substrate 2. A semiconductor device according to the second embodiment has almost the same structure as that of the semiconductor device according to the first embodiment except that a $P^+$-type base region 224 and $N^+$-type source region 225 are formed in a cap layer 6.

FIGS. 25 to 30 are sectional views schematically showing a method of manufacturing a semiconductor device according to the second embodiment of the present invention. FIGS. 25 to 30 assume that only one trench 2a is formed for illustrative convenience.

In this method, a structure shown in FIG. 4 is obtained by the same method as that described in the first embodiment.

Figure 25:
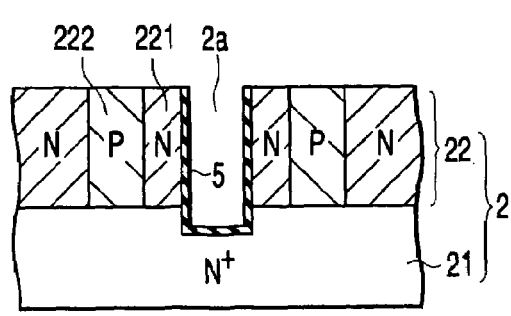

As shown in FIG. 25, the exposed surface of a substrate 2 is oxidized to form a silicon oxide layer 5. A silicon oxide layer 51 is then removed.

Figure 26:
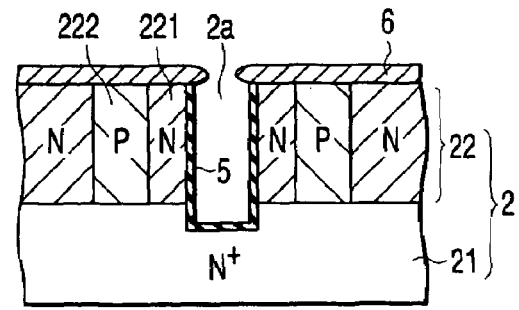

As shown in FIGS. 26 to 28, Si 6 is epitaxially grown on the exposed portion of the substrate 2. The growth of the Si 6 is done under conditions in which the Si 6 grows on only the exposed portion of the substrate 2 and does not grow on the silicon oxide layer 5. For example, epitaxial growth is performed under the same conditions as those described in the first embodiment. As a result, a single crystal layer covering the opening of the trench 2a is obtained as the cap layer 6.

As shown in FIG. 29, a surface of the substrate 2 on which the cap layer 6 is formed is planarized by CMP. Planarization is done such that the cap layer 6 remains by a sufficient thickness on the upper surface of the substrate 2 without exposing the upper surface of the substrate 2. This can prevent formation of an opening in the cap layer 6 at the position of the trench 2a due to excessive CMP. Further, the cap layer 6 can be utilized for various impurity-diffused regions, which will be described later.

In the second embodiment, the cap layer 6 is formed not only at the opening of the trench 2a but also on the entire upper surface of the semiconductor substrate 2. For this reason, as shown in FIG. 28, the cap layer 6 has relatively high flatness even before CMP. In the second embodiment, the cap layer 6 may not be subjected to CMP.

As shown in FIG. 30, a $P^+$-type base region 224, $N^+$-type source region 225, and $N^+$-type channel stopper region 226 are formed in the cap layer 6. The conductivity of a region of the cap layer 6 except the $P^+$-type base region 224, $N^+$-type source region 225, and $N^+$-type channel stopper region 226 is an $N^-$-type. A gate insulator 7 and gate electrode 8 are formed on the cap layer 6. An insulating layer 9, source electrode 3, and drain electrode 4 shown in FIG. 1 are formed. Accordingly, a semiconductor device 1 having almost the same structure as that shown in FIG. 1 is completed.

As described above, also in the second embodiment, similar to the first embodiment, the material of the cap layer 6 is almost the same as that of the semiconductor substrate 2, and the cap layer 6 is formed by a vacuum process. The second embodiment can suppress destruction of the cap layer 6 in a heat treatment.

The third embodiment of the present invention will be described.

In the first embodiment, portions of the oxide layer 5 and/or oxide layer 51 which are positioned at the boundary between the silicon oxide layer 51 and the sidewall of the trench 2a are removed, and Si is epitaxially grown on the exposed portions.

In the third embodiment, a portion of an oxide layer 5 which is positioned on the sidewall of a trench 2a is partially removed, and Si is epitaxially grown at the exposed portion. A semiconductor device according to the third embodiment has almost the same structure as that of the semiconductor device according to the first embodiment except that an opening is formed in an insulating layer formed on the sidewall of the trench 2a.

FIGS. 31 to 37 are sectional views schematically showing a method of manufacturing a semiconductor device according to the third embodiment of the present invention. FIGS. 31 to 37 assume that only one trench 2a is formed for illustrative convenience.

In this method, a structure shown in FIG. 4 is obtained by the same method as that described in the first embodiment. Also in this case, the opening width of the trench 2a is, e.g., 4 µm.

As shown in FIG. 31, the exposed surface of a substrate 2 is oxidized to form a silicon oxide layer 5 having a thickness of 0.3 µm.

Subsequently, the silicon oxide layer 5 and a silicon oxide layer 51 are anisotropically etched. As shown in FIG. 32, the silicon oxide layer 51 is removed, and a portion of the silicon oxide layer 5 which is positioned within a range from the opening of the trench 2a to a depth of 3 µm is removed.

Figure 33:
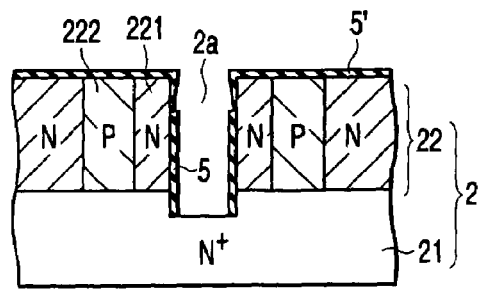

A silicon oxide is deposited on a surface of the substrate 2 in which the trench 2a is formed. Deposition of the silicon oxide is done under conditions in which the silicon oxide is hardly deposited at a position at which the depth from the opening of the trench 2a exceeds 2.2 µm. As shown in FIG. 33, a silicon oxide layer 5' whose portion on the sidewall of the trench 2a decreases in thickness from the opening toward the silicon oxide layer 5 is obtained.

Figure 34:
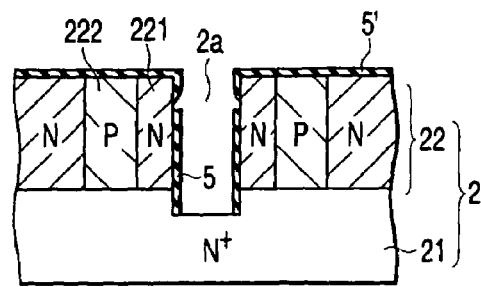

The silicon oxide layers 5 and 5' are processed with an aqueous ammonium fluoride solution. This process is performed such that, of a portion of the silicon oxide layer 5' which is positioned on the sidewall of the trench 2a, a portion at the opening of the trench 2a remains and a portion on the silicon oxide layer 5 is removed. In this process, for example, the silicon oxide layer 5' is removed at a position at which the depth from the opening of the trench 2a exceeds 2.2 µm, and the silicon oxide layer 5' remains at a position at which the depth from the opening of the trench 2a is equal to or smaller than 2.2 µm. As shown in FIG. 34, obtained is a structure in which, of the sidewall of the trench 2a, a portion whose depth from the opening of the trench 2a falls within a range of 2.2 µm to 3 µm is exposed to the outside of the silicon oxide layers 5 and 5', and the remaining portion is covered with the silicon oxide layers 5 and 5'. That is, an insulating layer having a groove almost parallel to the opening of the trench 2a can be obtained.

Figure 35:
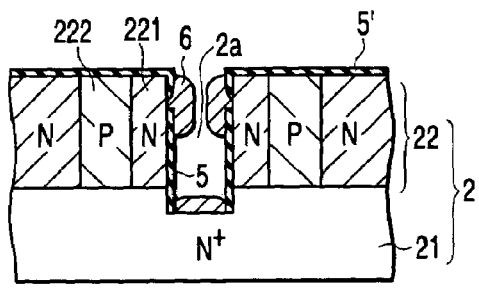
Figure 36:
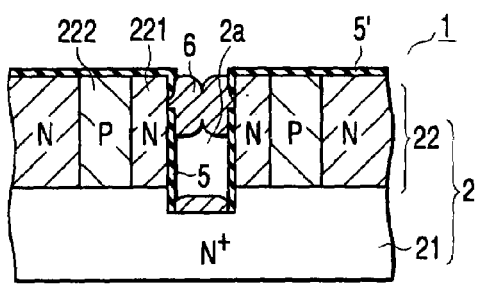

As shown in FIGS. 35 and 36, Si 6 is epitaxially grown on the exposed portion of the substrate 2. The growth of the Si 6 is done under conditions in which the Si 6 grows on only the exposed portion of the substrate 2 and does not grow on the silicon oxide layers 5 and 5'. For example, epitaxial growth is performed under the same conditions as those described in the first embodiment. Consequently, a single crystal layer covering the opening of the trench 2a is obtained as the cap layer 6. Epitaxial growth is done such that the top of the cap layer 6 becomes lower than the upper surface of the silicon oxide layer 5'. In this case, CMP described in the first and second embodiments with reference to FIGS. 9 and 29 can be omitted, and formation of an opening in the cap layer 6 due to CMP can be completely prevented.

Figure 37:
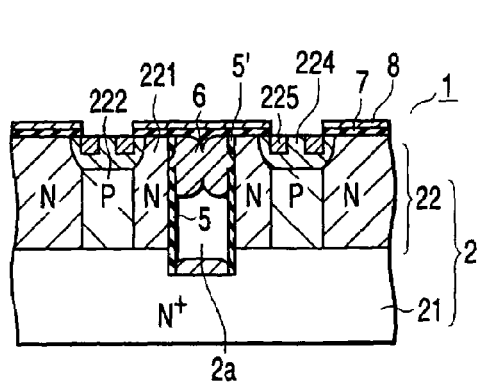

As shown in FIG. 37, a portion of the silicon oxide layer 5' which is positioned on the upper surface of the substrate 2 is removed. A $P^+$-type base region 224, $N^+$-type source region 225, and the like are formed in the surface region of the substrate 2. In this case, the conductivity of the cap layer 6 is a $P^{-+}$-type. A gate insulator 7 and gate electrode 8 are formed on the substrate 2. An insulating layer 9, source electrode 3, and drain electrode 4 shown in FIG. 1 are formed. Hence, a semiconductor device 1 having almost the same structure as that shown in FIG. 1 is completed.

As described above, in the third embodiment, similar to the first embodiment, the material of the cap layer 6 is almost the same as that of the semiconductor substrate 2, and the cap layer 6 is formed by a vacuum process. The third embodiment can suppress destruction of the cap layer 6 in a heat treatment.

In the third embodiment, various sizes may be defined as follows.

Figure 38:
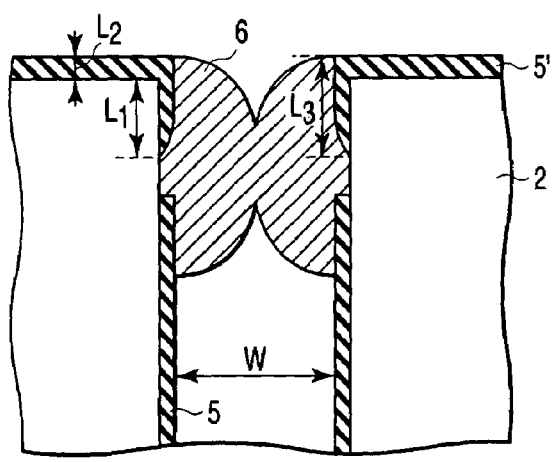
FIG. 38 is an enlarged sectional view showing a structure in FIG. 36.

FIG. 38 is an enlarged sectional view showing the structure in FIG. 36. In FIG. 38, $L_1$ represents the distance from the upper surface of the substrate 2 to the lower end of the insulating layer 5', and $L_2$ represents the thickness of the insulating layer 5' on the upper surface of the substrate 2. $L_3$ represents the distance from the lower end of the insulating layer 5' to the upper end of the cap layer 6 in the vertical direction, and W represents the distance between the insulating layer 5' formed on one sidewall of the trench 2a and the insulating layer 5' formed on the other sidewall.

Assuming that the Si growth progresses at the same speed in the vertical and horizontal directions, the distance $L_3$ and width W must satisfy an inequality: $2 \times L_3 > W$ in order to obtain the cap layer 6 covering the opening of the trench 2a.

To position the upper end of the cap layer 6 below the upper surface of the insulating layer 5', the distances $L_1$ to $L_3$ satisfy an inequality: $L_3 < L_1 + L_2$.

From this, the distances $L_1$ and $L_2$ and the width W may be so defined as to satisfy an inequality: $W/2 < L_1 + L_2$.

To position the upper end of the cap layer 6 above the upper surface of the substrate 2, the distance $L_1$ and width W must satisfy an inequality: $L_1 < W/2$.

To position the upper end of the cap layer 6 between the upper surfaces of the substrate 2 and insulating layer 5', the distances $L_1$ and $L_2$ and the width W may be so defined as to satisfy an inequality: $W/2 < L_1 + L_2 < W/2 + L_2$.

The fourth embodiment of the present invention will be described.

Figure 39:
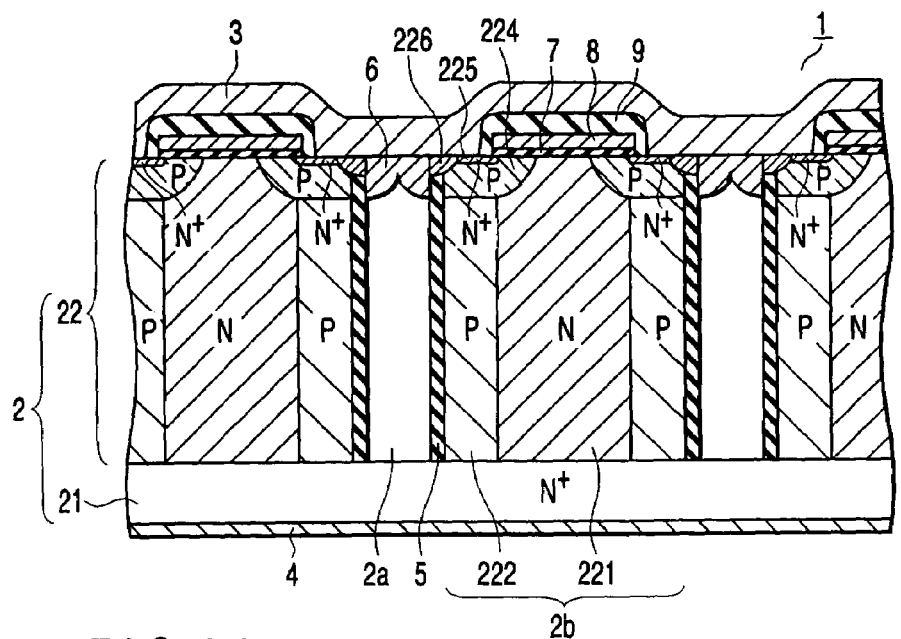
FIG. 39 is a sectional view schematically showing a semiconductor device according to the fourth embodiment of the present invention.

FIG. 39 is a sectional view schematically showing a semiconductor device according to the fourth embodiment of the present invention. The positions of a first impurity-diffused region 221 and second impurity-diffused region 222 are counterchanged between a semiconductor device 1 shown in FIG. 39 and the semiconductor device 1 shown in FIG. 1. In accordance with this difference in layout, the layout of a base region 224, source region 225, gate insulator 7, gate electrode 8, and the like is different between the semiconductor device 1 shown in FIG. 39 and the semiconductor device 1 shown in FIG. 1. The semiconductor device 1 shown in FIG. 39 has almost the same structure as that of the semiconductor device 1 shown in FIG. 1 except the layout.

More specifically, the source region 225 is positioned in the surface region of a second semiconductor layer 22 above the second impurity-diffused region 222, and extends in a direction perpendicular to the sheet surface. The base region 224 is interposed between the source region 225 and the first impurity-diffused region 221 and between the source region 225 and the second impurity-diffused region 222, and extends in a direction perpendicular to the sheet surface. A channel stopper region 226 is interposed between the source region 225 and a cap layer 6 and between the base region 224 and the cap layer 6 in the surface region of the second semiconductor layer 22, and extends in a direction perpendicular to the sheet surface.

The semiconductor device 1 can be manufactured by, e.g., the following method. The manufacturing method will be explained with reference to FIGS. 40 to 44.

FIGS. 40 to 44 are sectional views schematically showing a method of manufacturing a semiconductor device according to the fourth embodiment of the present invention. FIGS. 40 to 44 assume that only one trench 2a is formed for illustrative convenience.

According to this method, a structure shown in FIG. 3 is obtained by the same method as that described in the first embodiment.

Figure 40:
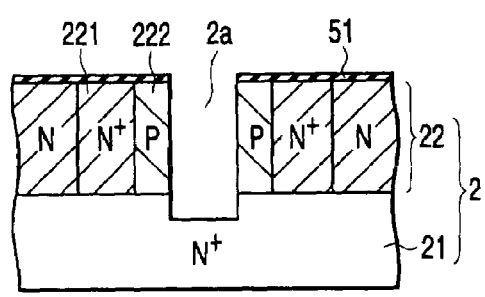
FIGS. 40 to 44 are sectional views schematically showing a method of manufacturing a semiconductor device according to the fourth embodiment of the present invention.

P is ion-implanted into the sidewall of the trench 2a and thermally diffused. Subsequently, B is ion-implanted into the sidewall of the trench 2a and thermally diffused. Accordingly, as shown in FIG. 40, an $N^+$-type first impurity-diffused region 221 and P-type second impurity-diffused region 222 are obtained.

Figure 41:
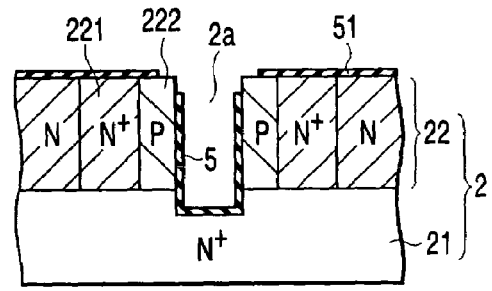

A structure shown in FIG. 41 is obtained by the same method as that described in the first embodiment. That is, the sidewall of a trench 2a and the upper surface of a substrate 2 are covered with silicon oxide layers 5 and 51, and exposed to the outside of the silicon oxide layers 5 and 51 at the opening of the trench 2a.

Figure 42:
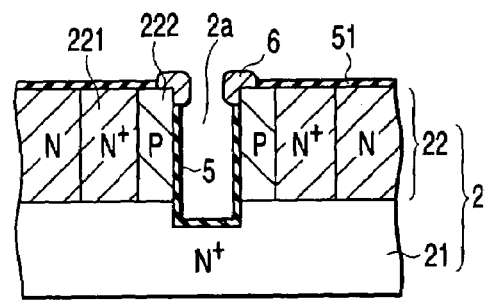
Figure 43:
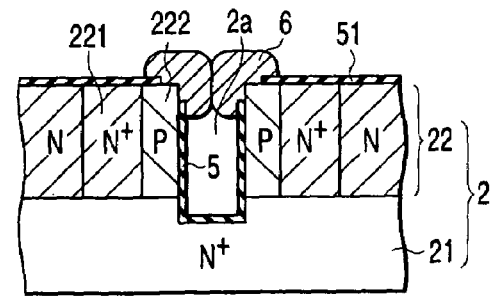

As shown in FIGS. 42 and 43, Si 6 is epitaxially grown on the exposed portion of the substrate 2. The growth of the Si 6 is done under conditions in which the Si 6 grows on only the exposed portion of the substrate 2 and does not grow on the silicon oxide layer. For example, epitaxial growth is performed under the same conditions as those described in the first embodiment. As a result, a single crystal layer covering the opening of the trench 2a is obtained as the cap layer 6.

Figure 44:
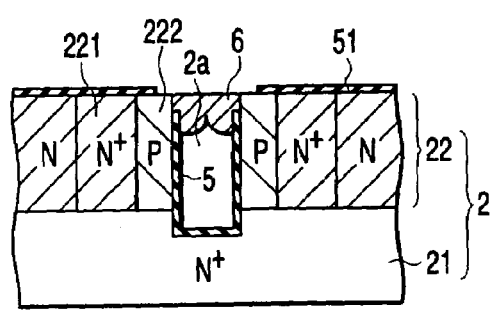

As shown in FIG. 44, a surface of the substrate 2 on which the cap layer 6 is formed is planarized by CMP. At this time, the silicon oxide layer 51 is used as a stopper film.

The silicon oxide layer 51 is removed, and a $P^+$-type base region 224, $N^+$-type source region 225, and channel stopper region 226 serving as a $P^+$-type impurity-diffused region are formed in the surface region of the substrate 2. Thereafter, a gate insulator 7, gate electrode 8, insulating layer 9, source electrode 3, and drain electrode 4 are formed. A semiconductor device having almost the same structure as that shown in FIG. 39 is completed.

As described above, in the fourth embodiment, similar to the first embodiment, the material of the cap layer 6 is almost the same as that of the semiconductor substrate 2, and the cap layer 6 is formed by a vacuum process. The fourth embodiment can suppress destruction of the cap layer 6 in a heat treatment.

In the fourth embodiment, the semiconductor device 1 may employ the following structure.

Figure 45:
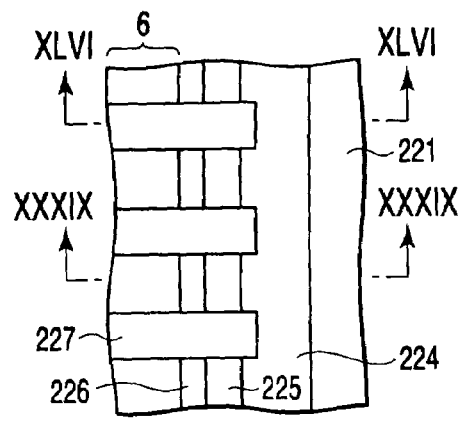
FIG. 45 is a plan view schematically showing an example of a structure applicable to the semiconductor device according to the fourth embodiment of the present invention.
Figure 46:
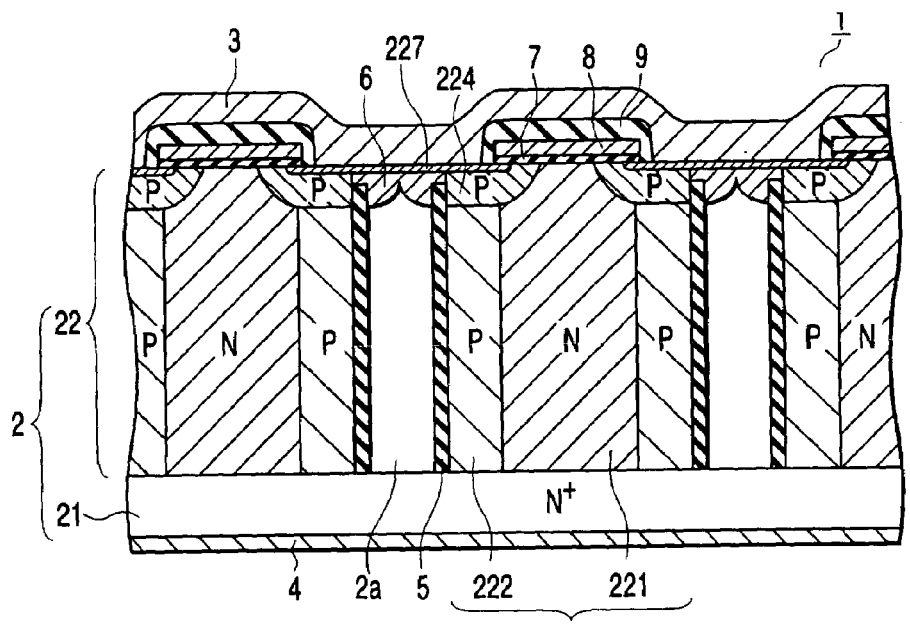
FIG. 46 is a sectional view schematically showing a semiconductor device according to the fourth embodiment of the present invention which adopts the structure shown in FIG. 45.

FIG. 45 is a plan view schematically showing an example of a structure applicable to the semiconductor device according to the fourth embodiment of the present invention. FIG. 46 is a sectional view schematically showing a semiconductor device according to the fourth embodiment of the present invention which adopts the structure shown in FIG. 45. FIG. 45 illustrates the upper surface of the semiconductor device 1 in FIG. 39, and does not illustrate the gate insulator 7, gate electrode 8, insulating layer 9, and source electrode 3. The section shown in FIG. 46 corresponds to the section along the line XLVI-XLVI in FIG. 45, and the section along the line XXXIX-XXXIX in FIG. 45 corresponds to the section shown in FIG. 39.

In the structure shown in FIGS. 45 and 46, $P^+$-type extension regions 227 are formed in surface regions of the $N^+$-type cap layer 6 and the substrate 2. Each extension region 227 is in contact with a pair of $P^+$-type base regions 224 adjacent to each other with the trench 2a interposed therebetween and extends in the cross direction of the gate electrode 8. The $P^+$-type extension regions 227 are arrayed in the longitudinal direction of the gate electrode 8, and adjacent $P^+$-type extension regions 227 are spaced apart from each other.

Since the upper surface of the base region 224 is partially covered with the gate insulator 7 and insulating layer 9, the contact area between the base region 224 and the source electrode 3 is not so large. When no extension region 227 is formed, it may be difficult to achieve a reliable connection between the base region 224 and the source electrode 3.

To the contrary, if the extension region 227 is formed, the base region 224 and source electrode 3 can be connected through the extension region 227. Since most of the upper surface of the extension region 227 is exposed to the outside of the gate insulator 7 and insulating layer 9, the contact area between the extension region 227 and the source electrode 3 can be enlarged. Hence, formation of the extension region 227 can easily achieve a reliable connection between the base region 224 and the source electrode 3.

The fifth embodiment of the present invention will be described.

A semiconductor device according to the fifth embodiment has almost the same structure as that of the semiconductor device 1 according to the fourth embodiment except that a cap layer 6 and base region 224 form one impurity-diffused region.

The semiconductor device according to the fifth embodiment can be manufactured by, e.g., the following method.

Figure 47:
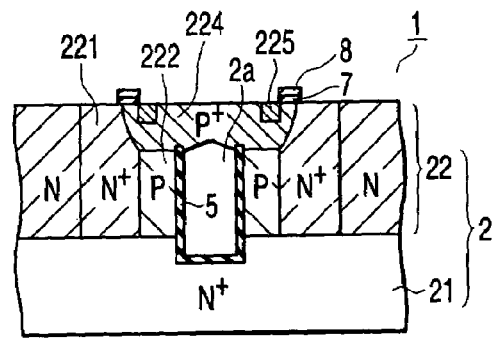
FIG. 47 is a sectional view schematically showing a method of manufacturing a semiconductor device according to the fifth embodiment of the present invention.
Figure 48:
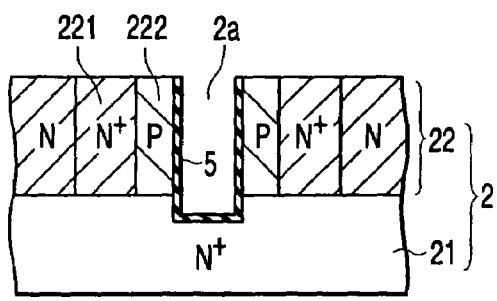
FIGS. 48 to 52 are sectional views schematically showing a method of manufacturing a semiconductor device according to the sixth embodiment of the present invention.

FIG. 47 is a sectional view schematically showing a method of manufacturing a semiconductor device according to the fifth embodiment of the present invention. FIG. 47 assumes that only one trench 2a is formed for illustrative convenience.

In this method, a structure shown in FIG. 44 is obtained by the same method as that described in the fourth embodiment. After that, a silicon oxide layer 51 is removed. As shown in FIG. 47, a $P^+$-type impurity-diffused region 224 is formed in the surface region of a substrate 2 and a cap layer 6, and an $N^+$-type source region 225 is formed in the surface region of the substrate 2. A portion of the $P^+$-type impurity-diffused region 224 which is positioned in a second semiconductor layer 22 functions as a base region. A gate insulator 7 and gate electrode 8 are formed, and an insulating layer 9, source electrode 3, and drain electrode 4 as shown in FIG. 39 are formed. Consequently, a semiconductor device 1 is completed.

As described above, in the fifth embodiment, similar to the first embodiment, the material of the cap layer 6 is almost the same as that of the semiconductor substrate 2, and the cap layer 6 is formed by a vacuum process. The fifth embodiment can suppress destruction of the cap layer 6 in a heat treatment.

The sixth embodiment of the present invention will be described.

In the fourth embodiment, epitaxial growth of Si occurs only near the opening of the trench 2a. In the sixth embodiment, epitaxial growth of Si also occurs on the upper surface of a substrate 2. A semiconductor device according to the sixth embodiment has almost the same structure as that of the semiconductor device according to the fourth embodiment except that a $P^+$-type base region 224, $N^+$-type source region 225, and the like are formed in a cap layer 6.

FIGS. 48 to 52 are sectional views schematically showing a method of manufacturing a semiconductor device according to the sixth embodiment of the present invention. FIGS. 48 to 52 assume that only one trench 2a is formed for illustrative convenience.

In this method, a structure shown in FIG. 40 is obtained by the same method as that described in the fourth embodiment.

The exposed surface of a substrate 2 is oxidized to form a silicon oxide layer 5. A silicon oxide layer 51 is then removed to obtain a structure shown in FIG. 48.

Figure 49:
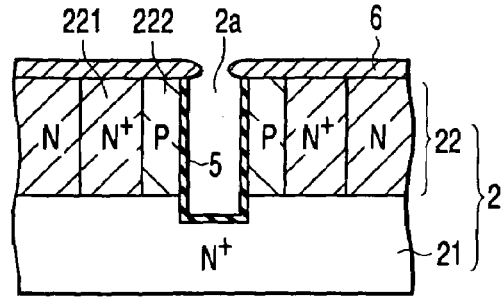
Figure 50:
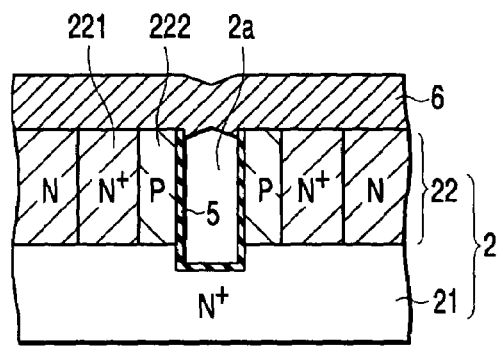

As shown in FIGS. 49 and 50, Si 6 is epitaxially grown on the exposed portion of the substrate 2. The growth of the Si 6 is done under conditions in which the Si 6 grows on only the exposed portion of the substrate 2 and does not grow on the silicon oxide layer 5. For example, epitaxial growth is performed under the same conditions as those described in the first embodiment. As a result, a single crystal layer covering the opening of the trench 2a is obtained as the cap layer 6.

Figure 51:
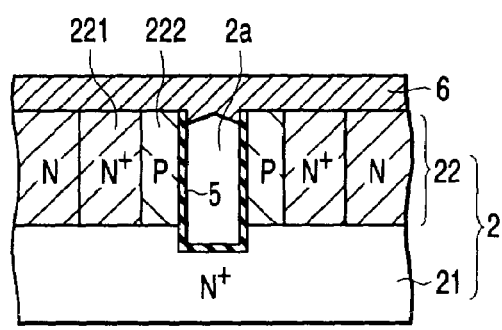

As shown in FIG. 51, a surface of the substrate 2 on which the cap layer 6 is formed is planarized by CMP. Also in the sixth embodiment, similar to the second embodiment, the cap layer 6 may not be subjected to CMP.

Figure 52:
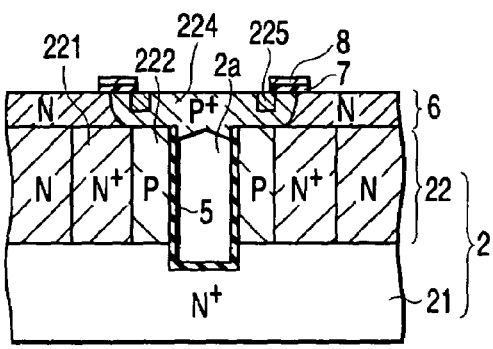

As shown in FIG. 52, a $P^+$-type base region 224 and $N^+$-type source region 225 are formed in the cap layer 6. The conductivity of a region of the cap layer 6 except the $P^+$-type base region 224 and $N^+$-type source region 225 is an N-type. A gate insulator 7 and gate electrode 8 are formed on the cap layer 6. An insulating layer 9, source electrode 3, and drain electrode 4 shown in FIG. 39 are formed. Accordingly, a semiconductor device 1 having almost the same structure as that shown in FIG. 39 is completed.

As described above, in the sixth embodiment, similar to the first embodiment, the material of the cap layer 6 is almost the same as that of the semiconductor substrate 2, and the cap layer 6 is formed by a vacuum process. The sixth embodiment can suppress destruction of the cap layer 6 in a heat treatment.

The seventh embodiment of the present invention will be described.

In the first to sixth embodiments, the cap layer 6 has a single-layered structure. In contrast, the seventh embodiment forms a cap layer 6 of a multilayered structure. A semiconductor device according to the seventh embodiment has almost the same structure as that of the semiconductor device 1 according to the first embodiment except that the multilayered structure is employed for the cap layer 6.

FIGS. 53 to 58 are sectional views schematically showing a method of manufacturing a semiconductor device according to the seventh embodiment of the present invention. FIGS. 53 to 58 assume that a plurality of trenches 2a are formed.

Figure 53:
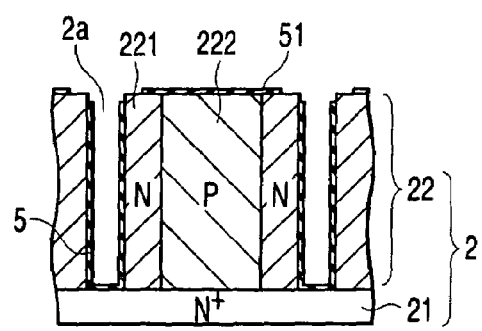
FIGS. 53 to 58 are sectional views schematically showing a method of manufacturing a semiconductor device according to the seventh embodiment of the present invention.

In this method, a structure shown in FIG. 53 is obtained by the same method as that described in the first embodiment with reference to FIGS. 2 to 5.

Figure 54:
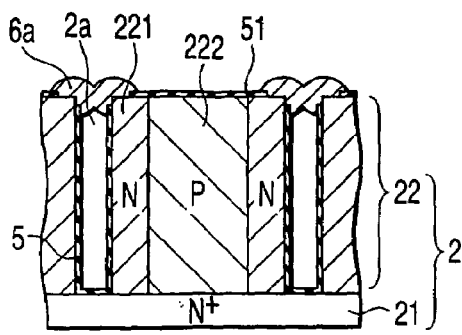

Si is epitaxially grown on a surface of a substrate 2 which is exposed to the outside of insulating layers 5 and 51. As shown in FIG. 54, the opening of the trench 2a is covered with an Si single crystal layer 6a. The single crystal layer 6a can be formed under the same conditions as those described for the cap layer 6 in the first embodiment. In the seventh embodiment, a polycrystalline layer 6b is formed on the single crystal layer 6a, which will be described later. Thus, the single crystal layer 6a itself suffices to cover only the opening of the trench 2a and need not be formed thick.

Figure 55:
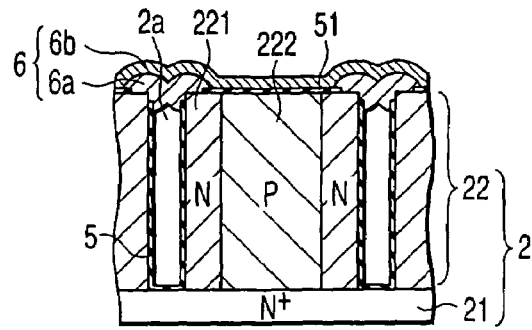

As shown in FIG. 55, a polysilicon layer is formed as the polycrystalline layer 6b on the single crystal layer 6a by, e.g., LP-CVD (Low Pressure Chemical Vapor Deposition). At this time, the polysilicon layer is also formed on a surface of the insulating layer 51 which is exposed to the outside of the single crystal layer 6a. Accordingly, a cap layer 6 including the single crystal layer 6a and polycrystalline layer 6b is obtained.

Figure 56:
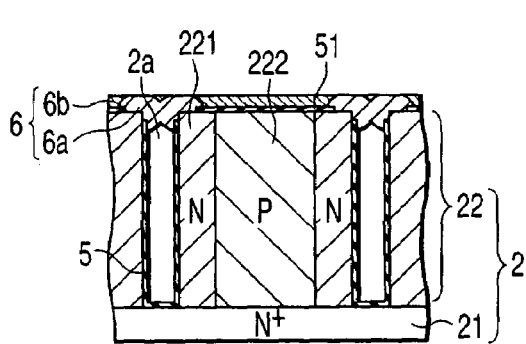

As shown in FIG. 56, a surface of the substrate 2 on which the polycrystalline layer 6b is formed is planarized by CMP.

Figure 57:
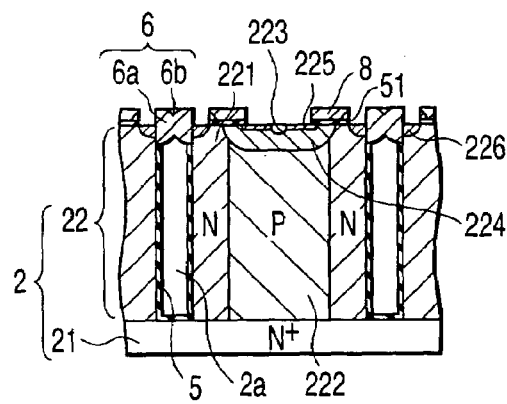

As shown in FIG. 57, the single crystal layer 6a, polycrystalline layer 6b, and insulating layer 51 are patterned. A P-type impurity-diffused region 223, $P^+$-type base region 224, $N^+$-type source region 225, and channel stopper region 226 are formed in the surface region of the substrate 2. At this time, a part of the polycrystalline layer 6b is formed as a gate electrode 8. A part of the insulating layer 51 is used as a gate insulator.

Figure 58:
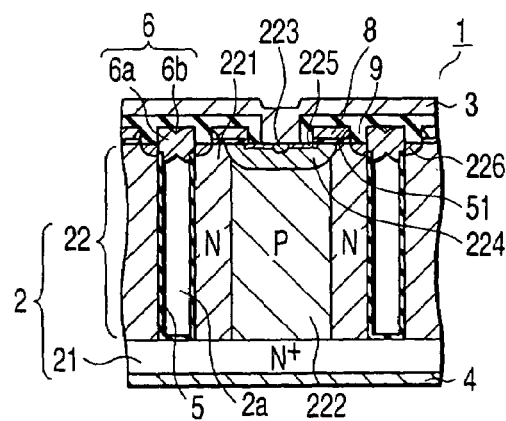

As shown in FIG. 58, an insulating layer 9, source electrode 3, and drain electrode 4 are formed, completing a semiconductor device 1.

Figure 59:
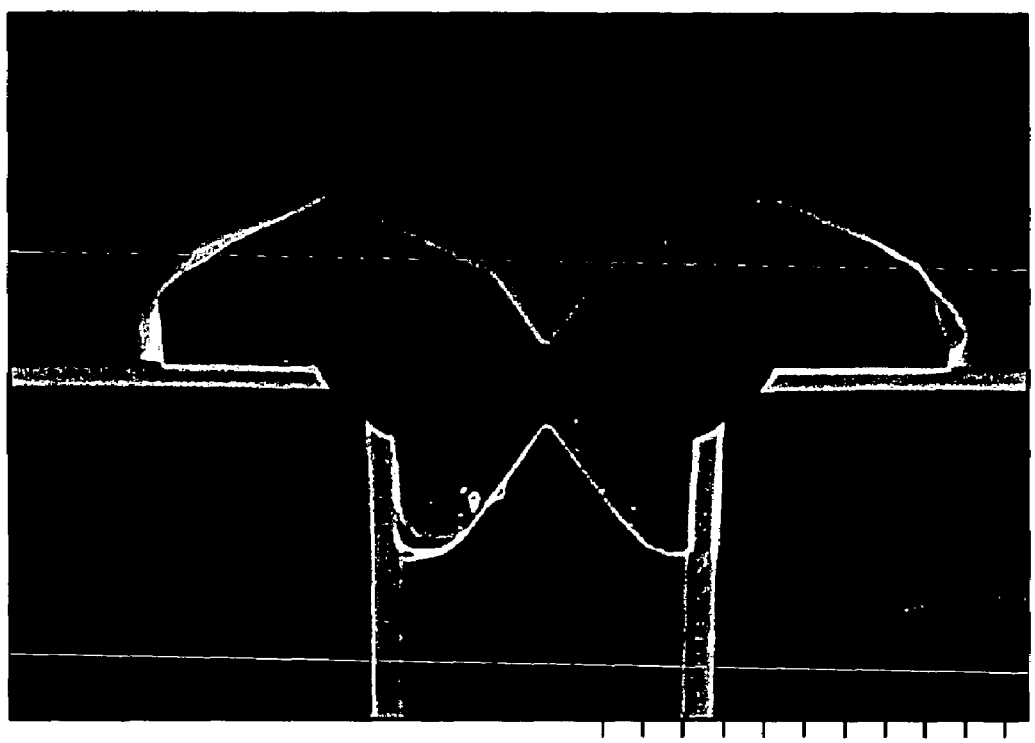
FIG. 59 is a view showing the electron micrograph of the structure in FIG. 54.

FIG. 59 shows the electron micrograph of the structure in FIG. 54. The micrograph in FIG. 59 is obtained by photographing a section near the opening of the trench 2a, and shows a thin single crystal layer 6a.

In the case where the single crystal layer 6a is formed thin as shown in FIG. 59, if the cap layer 6 is formed only from the single crystal layer 6a, an opening may be formed in the cap layer 6 at the position of the trench 2a by CMP described with reference to FIG. 56. To prevent this, the cap layer 6 is desired to be sufficiently thick. However, selective epitaxial growth cannot be carried out with a high film formation rate, and the number of simultaneously processible substrates is limited. For this reason, it is difficult to achieve high productivity when a thick cap layer 6 is formed only by selective epitaxial growth.

To the contrary, in the seventh embodiment, the polycrystalline layer 6b is formed by LP-CVD on the single crystal layer 6a, which is formed by selective epitaxial growth, and the single crystal layer 6a and polycrystalline layer 6b form the cap layer 6. LP-CVD cannot be carried out with a very high film formation rate, but can simultaneously process many, e.g., 100 substrates. The seventh embodiment can therefore achieve higher productivity in addition to the same effects as those described in the first embodiment.

In the seventh embodiment, CMP described with reference to FIG. 56 is performed such that the cap layer 6 remains by a sufficient thickness on the insulating layer 51 without exposing the insulating layer 51. This can prevent formation of an opening in the cap layer 6 at the position of the trench 2a due to excessive CMP.

In the seventh embodiment, a part of the insulating layer 51 utilized for selective growth of Si is used as a gate insulator. A portion of the insulating layer 51 which is used as a gate insulator is not exposed to the outside after formation of the cap layer 6. In other words, a portion of the silicon oxide layer 51 which is used as a gate insulator is not damaged by CMP or the like. Hence, a reliable MOSFET can be obtained.

In the seventh embodiment, the polycrystalline layer 6b is formed by LP-CVD on the single crystal layer 6a which is formed by selective epitaxial growth. Alternatively, Si may be grown by nonselective epitaxial growth on the single crystal layer 6a which is formed by selective epitaxial growth. Nonselective epitaxial growth can achieve a very high deposition rate, compared to selective epitaxial growth. For example, the deposition rate is about 0.1 μm/min to 0.2 μm/min in selective epitaxial growth and 1.0 μm/min to 2.0 μm/min in nonselective epitaxial growth. Also in this case, the seventh embodiment can achieve higher productivity than that in the first embodiment, in addition to the same effects as those described in the first embodiment.

When Si is grown by nonselective epitaxial growth in the process described with reference to FIG. 55 instead of forming a polycrystalline layer by LP-CVD, a structure different from that shown in FIG. 55 can be obtained.

FIG. 60 is a sectional view schematically showing an example of a structure obtained when Si is grown by nonselective epitaxial growth instead of forming a polysilicon layer shown in FIG. 55 by LP-CVD. As shown in FIG. 60, single crystal silicon grows on the single crystal layer 6a by performing nonselective epitaxial growth of Si on the structure shown in FIG. 54. That is, the thickness of the single crystal layer 6a increases. In contrast, polysilicon mainly grows on the insulating layer 51. That is, the polycrystalline layer 6b is formed on the insulating layer 51. In this manner, the cap layer 6 is generally formed only from the single crystal layer 6a when Si is grown by non-selective epitaxial growth instead of forming a polycrystalline layer by LP-CVD.

The eighth embodiment of the present invention will be described.

In the eighth embodiment, the positions of a first impurity-diffused region 221 and second impurity-diffused region 222 are counterchanged from those in the semiconductor device 1 according to the seventh embodiment. In accordance with the difference in layout, the eighth embodiment changes the layout of a base region 224, source region 225, gate insulator 7, gate electrode 8, and the like from that in the semiconductor device 1 according to the seventh embodiment. The eighth embodiment is almost the same as the seventh embodiment except the layout.

FIGS. 61 to 64 are sectional views schematically showing a method of manufacturing a semiconductor device according to the eighth embodiment of the present invention. FIGS. 61 to 64 assume that a plurality of trenches 2a are formed.

According to this method, the process described in the fourth embodiment with reference to FIGS. 40 and 41 is carried out, and the process described in the seventh embodiment with reference to FIGS. 54 and 55 is carried out. Consequently, a structure shown in FIG. 61 is obtained.

As shown in FIG. 62, a surface of a substrate 2 on which a polycrystalline layer 6b is formed is planarized by CMP. CMP is performed such that a cap layer 6 remains by a sufficient thickness on an insulating layer 51 without exposing the insulating layer 51.

As shown in FIG. 63, a single crystal layer 6a, the polycrystalline layer 6b, and the silicon oxide layer 51 are patterned. A P-type impurity-diffused region 223 serving as a channel stopper region, a P+-type base region 224, and an N+-type source region 225 are formed in the surface region of the substrate 2. At this time, a part of the polycrystalline layer 6b is formed as a gate electrode 8. A part of the insulating layer 51 is used as a gate insulator.

As shown in FIG. 64, an insulating layer 9, source electrode 3, and drain electrode 4 are formed, completing a semiconductor device 1.

Also in the eighth embodiment, similar to the seventh embodiment, the polycrystalline layer 6b is formed by LP-CVD or nonselective epitaxial growth on the single crystal layer 6a, which is formed by selective epitaxial growth, and the single crystal layer 6a and polycrystalline layer 6b form the cap layer 6. Hence, the eighth embodiment can achieve the same effects as those described in the seventh embodiment.

The ninth embodiment of the present invention will be described.

In the first to eighth embodiments, the cap layer 6 is formed after carrying out ion implantation and a thermal diffusion for forming the first impurity-diffused region 221 and second impurity-diffused region 222. In the ninth embodiment, a thermal diffusion for forming a first impurity-diffused region 221 and/or a thermal diffusion for forming a second impurity-diffused region 222 are performed after forming a cap layer 6. The ninth embodiment is the same as the first to eighth embodiments except this process.

As described above with reference to FIGS. 2 to 10, the first impurity-diffused region 221 and second impurity-diffused region 222 of a semiconductor device 1 shown in FIG. 1 can be formed by performing ion implantation into the sidewall of a trench 2a and a thermal diffusion of impurities. Ion implantation for forming the first impurity-diffused region 221 is done while the upper surface of a second semiconductor layer 22 is covered with an insulating film so as to introduce an impurity into the second semiconductor layer 22 only from the sidewall of the trench 2a.

This method can form the first impurity-diffused region 221 with a thin film-like shape almost parallel to the sidewall of the trench 2a. In this method, however, the impurity introduction amount into a region of the second semiconductor layer 22 which is positioned near the opening of the trench 2a may become larger than that into a lower region. As a result, the first impurity-diffused region 221 may exhibit a corresponding impurity concentration distribution in which the impurity concentration is higher on an upper portion of the first impurity-diffused region 221 than on a lower portion. The impurity concentration distribution in the first impurity-diffused region 221 may distort the equipotential surface, decreasing the withstand voltage.

FIGS. 65 to 69 are sectional views schematically showing a method of manufacturing a semiconductor device according to the ninth embodiment of the present invention.

According to this method, a structure shown in FIG. 65 is obtained by the same method described in the first embodiment with reference to FIGS. 2 and 3. A silicon oxide layer 53 may be formed by, e.g., a LOCOS process. This allows easily forming a trench 2a even when a thick silicon oxide layer 53 is formed.

B is ion-implanted into the sidewall of the trench 2a, and As is ion-implanted into it. Alternatively, As is ion-implanted into the sidewall of the trench 2a, and B is ion-implanted into it. Alternatively, B is ion-implanted into the sidewall of the trench 2a and thermally diffused, and As is ion-implanted into the sidewall of the trench 2a. In any case, As is not thermally diffused on this stage. In addition, B is implanted deeper, and As is implanted shallower. For example, B ion implantation and As ion implantation are sequentially performed without thermally diffusing B and As.

The silicon oxide layer 53 is used as a mask in ion implantation. For this reason, the silicon oxide layer 53 contains impurities at a high concentration upon the completion of ion implantation. As shown in FIG. 66, the silicon oxide layer 53 is removed from the surface of an N-type semiconductor layer 22.

As shown in FIG. 67, a silicon oxide layer 5 is formed to cover the sidewall of the trench 2a, and a silicon oxide layer 51 is formed to cover the upper surface of the N-type semiconductor layer 22. The silicon oxide layers 5 and 51 expose the upper and side surfaces of the N-type semiconductor layer 22 near the opening of the trench 2a. The silicon oxide layer 5 may further cover the bottom surface of the trench 2a, as shown in FIG. 67, or may expose it. The structure shown in FIG. 67 can be formed by the method described with reference to FIGS. 11 to 15, the method described with reference to FIGS. 16 to 20, or the method described with reference to FIGS. 21 to 24.

A cap layer 6 shown in FIG. 68 is formed by the same method described in the first embodiment with reference to FIGS. 6 to 8.

After that, the impurities doped into the N-type semiconductor layer 22 are thermally diffused on any stage. For example, a heat treatment for thermally diffusing the impurities is performed before a surface of the substrate 2 on which the cap layer 6 is formed is planarized.

For example, As and B are thermally diffused in the N-type semiconductor layer 22 by a heat treatment at 1,150° C. for 45 min. As shown in FIG. 69, an N-type first impurity-diffused region 221 and P-type second impurity-diffused region 222 are formed in the N-type semiconductor layer 22. Since the N-type semiconductor layer 22 and cap layer 6 are in direct contact with each other at the opening of the trench 2a, As thermally diffuses from the N-type semiconductor layer 22 into the cap layer 6 near the opening of the trench 2a. This method can reduce the As concentration on an upper portion of the N-type first impurity-diffused region 221 in comparison with a case in which As is thermally diffused before the cap layer 6 is formed. This method can therefore make the impurity concentration in the first impurity-diffused region 221 more uniform.

The same process as that described with reference to FIGS. 9 and 10 is carried out, obtaining a semiconductor device 1 shown in FIG. 1.

According to this method, the impurity concentration in the first impurity-diffused region 221 can be made more uniform, as described above. Distortion of the equipotential surface can be reduced to implement a higher breakdown voltage.

This effect can be attained even when the cap layer 6 does not completely cover the opening of the trench 2a. In other words, this effect can be achieved even when impurities are thermally diffused while the cap layer 6 does not completely cover the opening of the trench 2a, as shown in FIGS. 6 and 7.

The techniques according to the first to ninth embodiments can be combined with each other. The techniques applied to a semiconductor device having a specific structure in the first to ninth embodiments can also be applied to a semiconductor device having another structure. For example, the above techniques may be applied to a semiconductor device including a MOSFET whose structure is different from that described above. The above techniques can also be applied to a semiconductor device including, e.g., a bipolar transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
a semiconductor substrate comprising a first semiconductor layer of a first conductivity and a pair of second semiconductor layers disposed on the first semiconductor layer and spaced apart from each other, the second semiconductor layers forming a trench therebetween and the first semiconductor layer forming a bottom surface of the trench, wherein each of the second semiconductor layers includes a first impurity diffused region of the first conductivity which extends from a lower surface toward an upper surface of the second semiconductor layer, and a second impurity diffused region of a second conductivity which extends from the lower surface toward the upper surface and is adjacent to the first impurity diffused region, the first and second impurity diffused regions being in contact with the first semiconductor layer;
an insulating layer covering a sidewall of the trench, wherein the insulating layer covers the whole surface of the sidewall of the trench; and
a cap layer which is in contact with the semiconductor substrate and covers an opening of the trench to form an enclosed space in the trench, a material of the cap layer being substantially the same as a material of the semiconductor substrate.

2. A semiconductor device, comprising:
a semiconductor substrate comprising a first semiconductor layer of a first conductivity and a pair of second semiconductor layers disposed on the first semiconductor layer and spaced apart from each other, the second semiconductor layers forming a trench therebetween and the first semiconductor layer forming a bottom surface of the trench, wherein each of the second semiconductor layers includes a first impurity diffused region of the first conductivity which extends from a lower surface toward an upper surface of the second semiconductor layer, and a second impurity diffused region of a second conductivity which extends from the lower surface toward the upper surface and is adjacent to the first impurity diffused region, the first and second impurity diffused regions being in contact with the first semiconductor layer;
an insulating layer covering a sidewall of the trench; and
a cap layer which is in contact with the semiconductor substrate and covers an opening of the trench to form an enclosed space in the trench, a material of the cap layer being substantially the same as a material of the semiconductor substrate,
wherein the cap layer further covers an upper surface of the semiconductor substrate.

3. A semiconductor device, comprising:
a semiconductor substrate comprising a first semiconductor layer of a first conductivity and a pair of second semiconductor layers disposed on the first semiconductor layer and spaced apart from each other, the second semiconductor layers forming a trench therebetween, wherein each of the second semiconductor layers includes a first impurity diffused region of the first conductivity which extends from a lower surface toward an upper surface of the second semiconductor layer, and a second impurity diffused region of a second conductivity which extends from the lower surface toward the upper surface and is adjacent to the first impurity diffused region, the first and second impurity diffused regions being in contact with the first semiconductor layer;
an insulating layer covering a sidewall of the trench; and
a cap layer which is in contact with the semiconductor substrate and covers an opening of the trench to form an enclosed space in the trench, a material of the cap layer being substantially the same as a material of the semiconductor substrate,
wherein the cap layer further covers an upper surface of the semiconductor substrate,
wherein the first and second impurity diffused regions extend from the lower surface to the upper surface of the second semiconductor layer,
wherein the cap layer includes a third impurity diffused region of the first conductivity which is in contact with the first impurity diffused region, a source region of the first conductivity whose upper surface is a part of an upper surface of the cap layer, and a base region of the second conductivity which is interposed between the third impurity diffused region and the source region and whose upper surface is another part of the upper surface of the cap layer, and wherein the device further comprises:

a gate electrode facing the upper surface of the base region; and a gate insulator interposed between the cap layer and the gate electrode.

4. The device according to claim 3, wherein the first impurity diffused region is interposed between the trench and the second impurity diffused region.

5. The device according to claim 4, wherein the gate electrode further faces a portion of the cap layer which corresponds to the trench with the gate insulator interposed therebetween.

6. The device according to claim 3, wherein the second impurity diffused region is interposed between the trench and the first impurity diffused region.

7. The semiconductor device according to claim 3, wherein at least a part of the cap layer and a part of the second semiconductor layer form an extension region of the second conductivity whose upper surface comprises an upper surface of the cap layer and another part of the upper surface of the second semiconductor layer, the extension region being adjacent to the base region.

8. A semiconductor device, comprising:

a semiconductor substrate comprising a first semiconductor layer of a first conductivity and a pair of second semiconductor layers disposed on the first semiconductor layer and spaced apart from each other, the second semiconductor layers forming a trench therebetween, wherein each of the second semiconductor layers includes a first impurity diffused region of the first conductivity which extends from a lower surface toward an upper surface of the second semiconductor layer, and a second impurity diffused region of a second conductivity which extends from the lower surface toward the upper surface and is adjacent to the first impurity diffused region, the first and second impurity diffused regions being in contact with the first semiconductor layer;

an insulating layer covering a sidewall of the trench; and a cap layer which is in contact with the semiconductor substrate and covers an opening of the trench to form an enclosed space in the trench, a material of the cap layer being substantially the same as a material of the semiconductor substrate, wherein the first impurity diffused region extends from the lower surface to the upper surface of the second semiconductor layer, wherein the second impurity diffused region is interposed between the trench and the first impurity diffused region, wherein each of the second semiconductor layers further includes a source region of the first conductivity whose upper surface is a part of the upper surface of the second semiconductor layer, wherein at least a part of the cap layer and a part of the second semiconductor layer form a base region of the second conductivity which is interposed between the source region and the first impurity diffused region and whose upper surface comprises an upper surface of the cap layer and another part of the upper surface of the second semiconductor layer, and wherein the device further comprises:

a gate electrode facing the upper surface of the base region; and a gate insulator interposed between the second semiconductor layer and the gate electrode.

* * * * *